(12) United States Patent
Ihara (10) Patent No.: US 9,337,224 B2
(45) Date of Patent: May 10, 2016

(54) CMOS IMAGE SENSOR AND METHOD OF MANUFACTURING THE SAME

(71) Applicant: SAMSUNG ELECTRONICS CO., LTD., Suwon-si, Gyeonggi-do (KR)

(72) Inventor: Hisanori Ihara, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 76 days.

(21) Appl. No.: 14/158,121

(22) Filed: Jan. 17, 2014

(65) Prior Publication Data

US 2014/0197464 A1 Jul. 17, 2014

(30) Foreign Application Priority Data

Jan. 17, 2013 (KR) .................. 10-2013-0005299

(51) Int. Cl.
*H01L 27/146* (2006.01)

(52) U.S. Cl.
CPC ...... *H01L 27/14614* (2013.01); *H01L 27/1461* (2013.01); *H01L 27/14689* (2013.01)

(58) Field of Classification Search
CPC ............................................... H01L 27/14614
See application file for complete search history.

(56) References Cited

U.S. PATENT DOCUMENTS

| 7,364,960 | B2 | 4/2008 | Lyu |
| 7,405,437 | B2 | 7/2008 | Shim et al. |
| 7,736,932 | B2 | 6/2010 | Roy |
| 7,825,438 | B2 | 11/2010 | Jung et al. |
| 8,399,914 | B2 | 3/2013 | Mabuchi |
| 2006/0138486 | A1 | 6/2006 | Lim |
| 2008/0210992 | A1 | 9/2008 | Kim |
| 2011/0042723 | A1* | 2/2011 | Mabuchi ............ 257/225 |
| 2011/0084322 | A1 | 4/2011 | Kang |
| 2011/0089311 | A1 | 4/2011 | Venezia et al. |
| 2011/0096208 | A1 | 4/2011 | Roy et al. |
| 2011/0108897 | A1 | 5/2011 | Koo et al. |
| 2012/0043589 | A1 | 2/2012 | Nozaki et al. |

FOREIGN PATENT DOCUMENTS

| JP | 2004-356246 | 12/2004 |
| JP | 2005-294701 | 10/2005 |
| JP | 2009-129931 | 6/2009 |
| JP | 2011-044548 | 3/2011 |
| KR | 10-2006-0108017 A | 10/2006 |
| KR | 10-2007-0070429 A | 7/2007 |

* cited by examiner

*Primary Examiner* — Peniel M Gumedzoe
*Assistant Examiner* — Christopher Johnson
(74) *Attorney, Agent, or Firm* — Lee & Morse, P.C.

(57) ABSTRACT

A CMOS image sensor has a photodiode including first and second impurity layers sequentially formed on a substrate, an isolation layer on the second impurity layer, and a transfer gate structure through the second impurity layer. The transfer gate structure contacts a top surface of the first impurity layer and a portion of the second impurity layer and includes a bottom surface having a step shape.

14 Claims, 7 Drawing Sheets

CMOS IMAGE SENSOR AND METHOD OF MANUFACTURING THE SAME

CROSS-REFERENCE TO RELATED APPLICATION

Korean Patent Application No. 10-2013-0005299, filed on Jan. 17, 2013, in the Korean Intellectual Property Office, and entitled: "CMOS Image Sensor and Method of Manufacturing the Same," is incorporated by reference herein in its entirety.

BACKGROUND

1. Field

Example embodiments relate to a CMOS image sensor and a method of manufacturing the same.

2. Description of the Related Art

Recently, semiconductor devices have been highly integrated, and a complementary metal oxide semiconductor (CMOS) image sensor (CIS) has been also highly integrated.

SUMMARY

Embodiments are directed to a CMOS image sensor including a photodiode including a first impurity layer and a second impurity layer sequentially formed on a substrate, an isolation layer on the second impurity layer, and a transfer gate structure through the second impurity layer, the transfer gate structure contacting a top surface of the first impurity layer and a portion of the second impurity layer, the transfer gate structure including a bottom surface having a step shape.

The transfer gate structure may include a gate electrode and a gate dielectric layer beneath the gate electrode.

The gate electrode may include a lower portion, a central portion, and an upper portion thereof. The lower portion of the gate electrode may contact the top surface of the first impurity layer via the gate dielectric layer. The central portion of the gate electrode may contact a portion of the second impurity layer via the gate dielectric layer. The upper portion of the gate electrode may contact a top surface of the second impurity layer and a top surface of the isolation layer via the gate dielectric layer.

A portion of the lower portion of the gate electrode may be in a non-overlapping relationship with the upper portion of the gate electrode, when viewed from a top side.

A portion of the central portion of the gate electrode may be in a non-overlapping relationship with the upper portion of the gate electrode, when viewed from a top side.

The first impurity layer and the second impurity layer may include different conductivity type impurities from each other.

Embodiments are also directed to a method of manufacturing a CMOS image sensor including sequentially forming a first impurity layer and second impurity layer on a substrate, forming an isolation layer on the second impurity layer, and forming a transfer gate structure through the second impurity layer, the transfer gate structure contacting a top surface of the first impurity layer and a portion of the second impurity layer, the transfer gate structure including a bottom surface having a step shape.

Forming the transfer gate structure may include forming a gate dielectric layer and a gate electrode sequentially stacked.

Forming the gate electrode may include forming a lower portion, a central portion, and an upper portion thereof.

Forming the gate dielectric layer and the gate electrode sequentially stacked may include removing a portion of the second impurity layer to expose the top surface of the first impurity layer, forming the gate dielectric layer on the exposed top surface of the first impurity layer and on the second impurity layer, and forming the gate electrode on the gate dielectric layer. The gate dielectric layer may be further formed on the isolation layer.

The first impurity layer and the second impurity layer may be formed to include different conductivity type impurities from each other, and form a photodiode.

Embodiments are also directed to a CMOS image sensor including a first impurity layer, a second impurity layer on the first layer, the first impurity layer and the second impurity layer forming a photodiode, an isolation layer on the second impurity layer, portions of the second impurity layer and the isolation layer being absent above the first impurity layer such that a portion of the first impurity layer is exposed and such that the second impurity layer includes steps between the exposed first impurity layer and a top surface of the second impurity layer, and a transfer gate structure extending through the second impurity layer, the transfer gate structure contacting the exposed top surface of the first impurity layer and the steps of the second impurity layer, the transfer gate structure including a bottom surface having a step shape complementary to the steps of the second impurity layer.

The transfer gate structure may include a gate electrode and a gate dielectric layer beneath the gate electrode.

A lower portion of the transfer gate structure may contact the top surface of the first impurity layer. A central portion of the transfer gate structure may contact the steps of the second impurity layer. An upper portion of the transfer gate structure may contact a top surface of the second impurity layer and a top surface of the isolation layer.

A portion of the upper portion of the transfer gate structure may not overlap part of the lower portion and central portion of the transfer gate structure, when viewed from a top side.

The CMOS image sensor may further include an insulation layer covering the transfer gate structure and exposed portions of the isolation layer.

The first impurity layer and the second impurity layer may include different conductivity type impurities from each other.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer or section without departing from the teachings of the present inventive concept.

Spatially relative terms, such as "beneath," "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "beneath" other elements or features would then be oriented "above" the other elements or features. Thus, the exemplary term "beneath" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope thereof.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
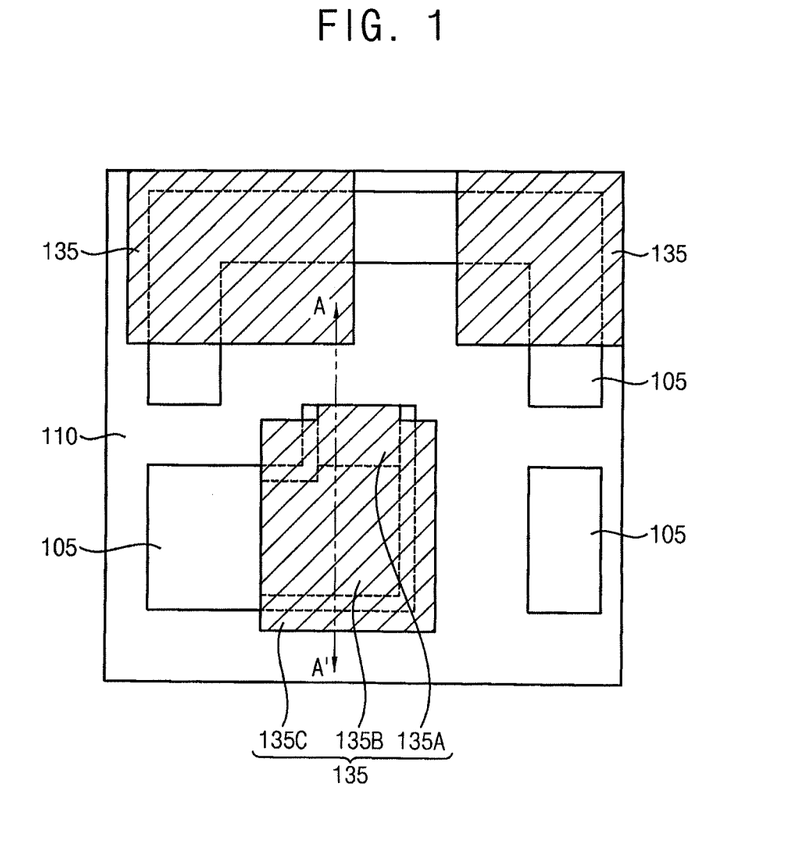
FIG. 1 illustrates a plan view depicting a unit cell of a CIS in accordance with example embodiments.
Figure 2:
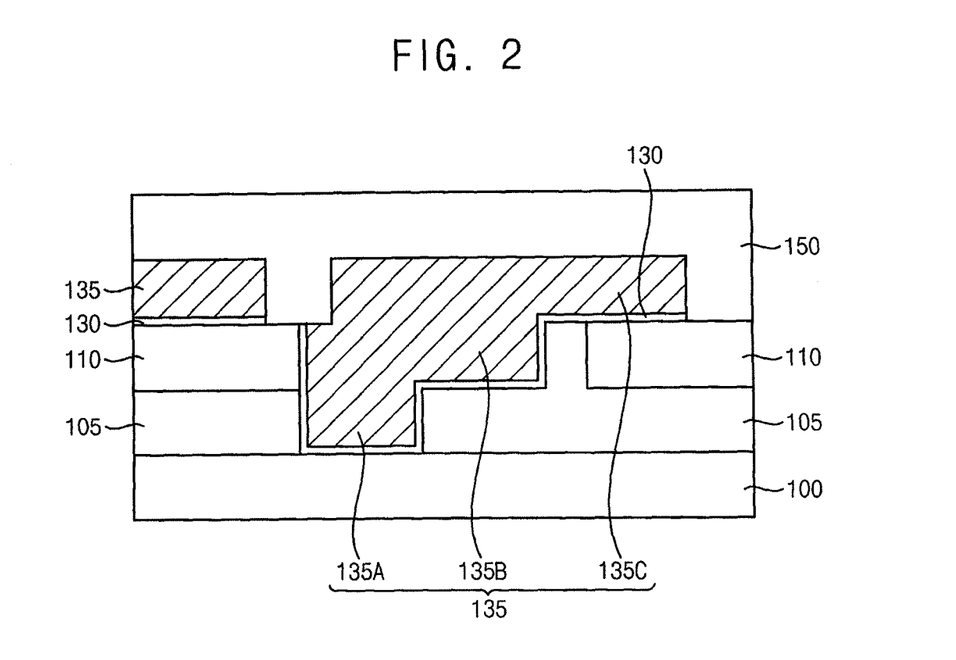
FIG. 2 illustrates a cross-sectional view cut along a line A-A' of FIG. 1.

FIG. 1 illustrates a plan view depicting a unit cell of a CIS in accordance with example embodiments, and FIG. 2 illustrates a cross-sectional view cut along a line A-A' of FIG. 1.

The CIS may include a photodiode, a floating diffusion region, a transfer transistor, a reset transistor, and a drive transistor, etc. The photodiode may receive light and convert the light into electrical signals, e.g., currents, voltages, etc. The transfer transistor may transfer electric charges from the photodiode to the floating diffusion region. The reset transistor may periodically reset the electric charges stored in the floating diffusion region. The drive transistor may serve as a source follower buffer amplifier and may buffer signals in accordance with the electric charges charged in the floating diffusion region.

Referring to FIGS. 1 and 2, in a region including the transfer transistor, the CIS may include first and second impurity layers 100 and 105 sequentially stacked on a substrate, an isolation layer 110 on the second impurity region 110, a transfer gate structure on the first and second impurity layers 100 and 105 and the isolation layer 110, and an insulation layer 150 covering the transfer gate structure.

The first and second impurity layers 100 and 105 may include first and second impurities of first and second conductivity types, respectively, and may form the photodiode.

The transfer gate structure may include a gate electrode 135 and a gate dielectric layer 130. The gate dielectric layer 130 may be formed beneath the gate electrode 135. For example, the gate dielectric layer 130 may be between the gate electrode 135 and other structures such as the first and second impurity layers 100 and 105 and the isolation layer 110. The gate electrode 135 may include, e.g., doped polysilicon or a metal, and the gate dielectric layer 130 may include, e.g., silicon oxide, a metal oxide, etc.

In example embodiments, the gate electrode 135 may include lower, central, and upper portions 135A, 135B, and 135C, respectively, and may include a bottom surface having a step shape. Through the gate dielectric layer 130, the lower portion of the gate electrode 135 may contact a top surface of the first impurity layer 100 and a sidewall of the second impurity layer 105. The central portion of the gate electrode 135 may contact a portion of the second impurity layer 105. The upper portion of the gate electrode 135 may contact a top surface of the second impurity layer 105. The transfer gate structure may contact the photodiode over a wide area. Image transfer lag or signal noise issues may be reduced.

FIGS. 3 to 7 illustrate cross-sectional views depicting stages of a method of manufacturing a CIS in accordance with example embodiments.

Figure 3:
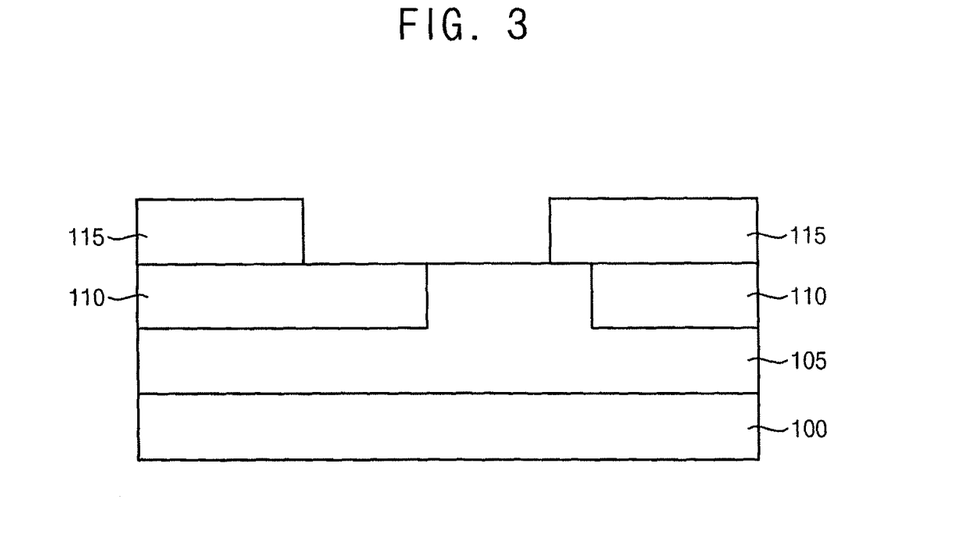
FIGS. 3 to 7 illustrate cross-sectional views depicting stages of a method of manufacturing a CIS in accordance with example embodiments.

Referring to FIG. 3, first and second impurity layers 100 and 105 may be formed on a substrate. The first impurity layer 100 may include first impurities of a first conductivity type, and the second impurity layer 105 may include second impurities of a second conductivity type. The first and second impurity layers 100 and 105 may form a photodiode that receives light and converts the light into electrical signals, e.g., currents or voltages. In example embodiments, the CIS may have a backside illumination (BSI) structure.

An isolation layer 110 may be formed on the second impurity layer 105. In example embodiments, the isolation layer 110 may be formed by a shallow trench isolation (STI) process.

A first photoresist pattern 115 may be formed on the isolation layer 110 and the second impurity layer 105. In example embodiments, the first photoresist pattern 115 may cover at least a portion of the isolation layer 110 and at least a portion of the second impurity layer 105.

Figure 4:
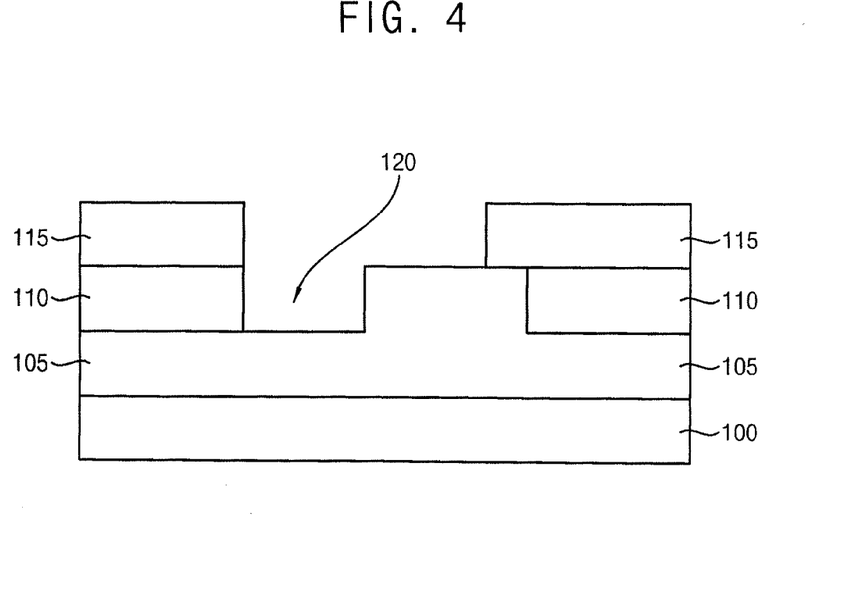

Referring to FIG. 4, the isolation layer 110 may be partially removed using the first photoresist pattern 115 as an etching mask to form a first hole 120. In the etching process, the second impurity layer 105 may be prevented from being etched due to the etching selectivity between the isolation layer 110 and the second impurity layer 105. Thus, an exposed upper surface of the second impurity layer 105 may have a step shape.

Figure 5:
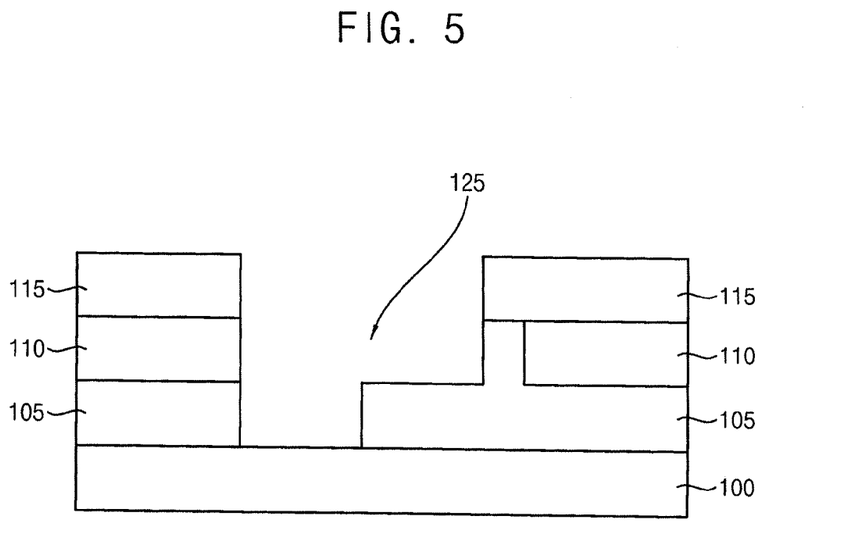

Referring to FIG. 5, the second impurity layer 105 may be partially removed using the first photoresist pattern as an etching mask to form a second hole 125. According to the step shape of the exposed upper surface of the second impurity layer 105, the second hole 125 may include a bottom surface of a step shape. In example embodiments, the second hole 125 may expose a top surface of the first impurity layer 100.

Figure 6:
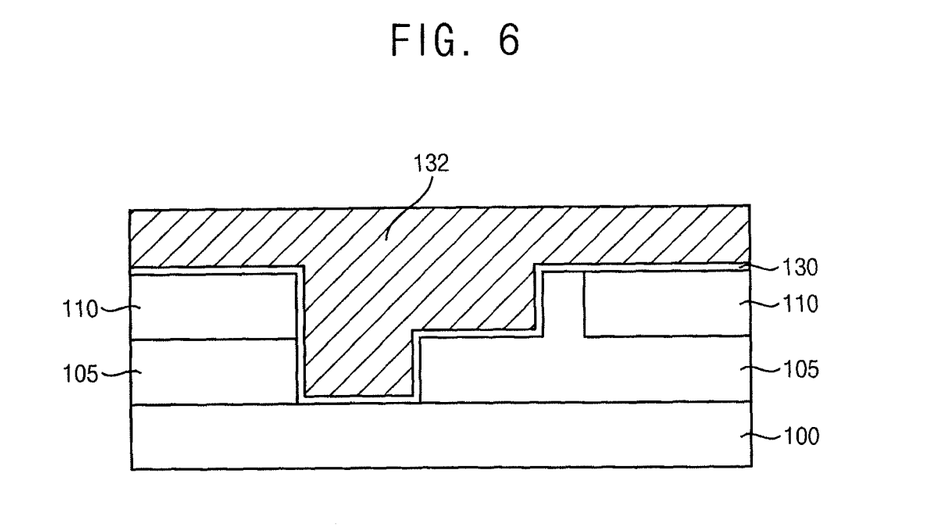

Referring to FIG. 6, after removing the first photoresist pattern 115, a gate dielectric layer 130 may be formed on the bottom surface and a sidewall of the second hole 125, on the second impurity layer 105, and on the isolation layer 110. The gate dielectric layer 130 may be formed to include, e.g., silicon oxide, a metal oxide, etc.

A gate electrode layer 132 may be formed on the gate dielectric layer 130 to sufficiently fill the second hole 125, and an upper portion of the gate electrode layer 132 may be planarized. The gate electrode layer 132 may be formed to include, e.g., doped polysilicon, or a metal.

Figure 7:
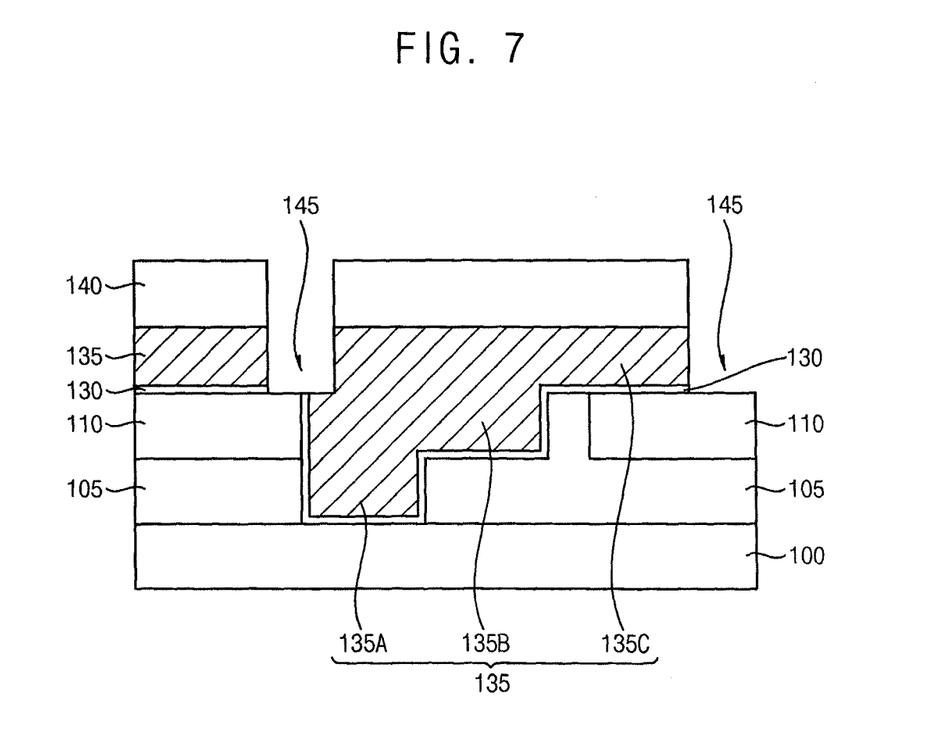

Referring to FIG. 7, a second photoresist pattern 140 may be formed on the gate electrode layer 132. The gate electrode layer 132 and the dielectric layer 130 may be patterned using the second photoresist pattern 140 as an etching mask. In the etching process, a third hole 145 may be formed such that the gate electrode layer 132 is divided into a plurality of gate electrodes 135. In example embodiments, at least one of the gate electrodes 135 may serve as a transfer gate electrode of the CIS, which includes a transfer gate structure together with the gate dielectric layer 130 therebeneath.

In example embodiments, the gate electrode 135 serving as the transfer gate electrode may include lower, central, and upper portions, which may form a step shape. Through the gate dielectric layer 130, the lower portion of the gate electrode 135 may contact the top surface of the first impurity layer 100 and a sidewall of the second impurity layer 105, the central portion of the gate electrode 135 may contact a portion of the second impurity layer 105, and the upper portion of the gate electrode 135 may contact a top surface of the second impurity layer 105. Accordingly, the gate structure may contact the photodiode over a wide area.

Referring to FIG. 2 again, after removing the second photoresist pattern 140, an insulation layer 150 may be formed on the gate electrodes 135 and the isolation layer 110 to sufficiently fill the third hole 145.

By the above processes, the CIS having a vertical transfer gate structure that contacts the photodiode over a wide area may be manufactured.

FIGS. 8 to 13 illustrate cross-sectional views depicting stages of a method of manufacturing a CIS in accordance with example embodiments.

Figure 8:
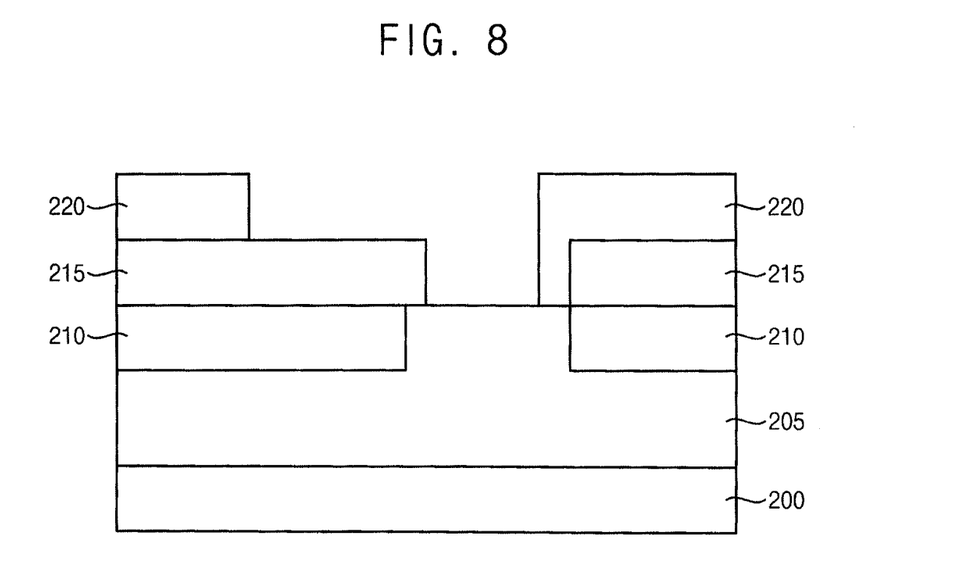
FIGS. 8 to 13 illustrate cross-sectional views depicting stages of a method of manufacturing a CIS in accordance with example embodiments.

Referring to FIG. 8, first and second impurity layers 200 and 205 may be formed on a substrate. The first impurity layer 200 may include first impurities of a first conductivity type, and the second impurity layer 205 may include second impurities of a second conductivity type. The first and second impurity layers 200 and 205 may form a photodiode that receives light and convert the light into electrical signals, e.g., currents or voltages. In example embodiments, the CIS may have a backside illumination (BSI) structure.

An isolation layer 210 may be formed on the second impurity layer 205. In example embodiments, the isolation layer 210 may be formed by a shallow trench isolation (STI) process.

A mesa structure 215 may be formed on the isolation layer 210 and the second impurity layer 205. In example embodiments, the mesa structure 215 may cover at least a portion of the isolation layer 210 and at least a portion of the second impurity layer 205. A first photoresist pattern 220 may be formed on the mesa structure 215 and the second impurity layer 205.

Figure 9:
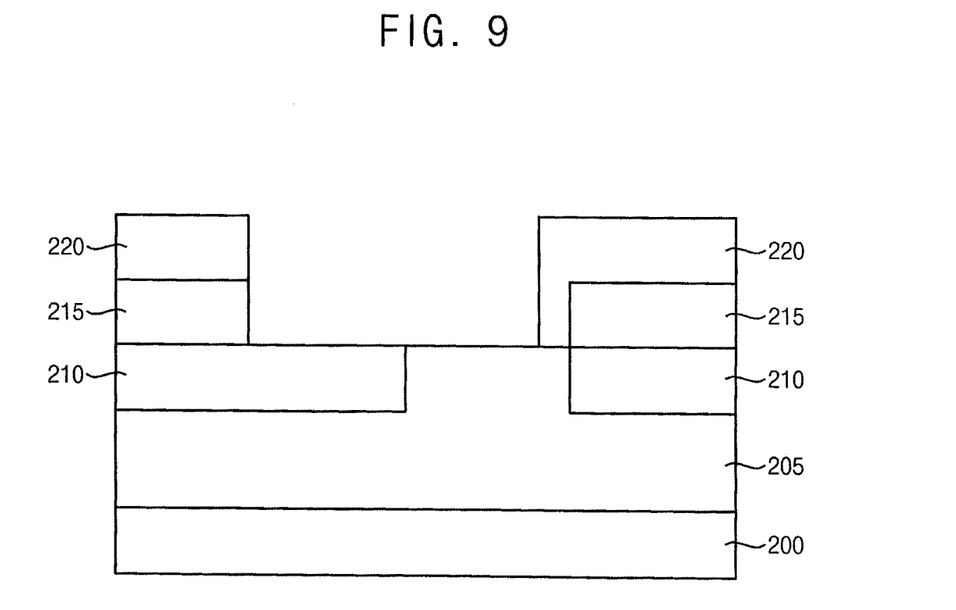

Referring to FIG. 9, the mesa structure 215 may be partially etched using the first photoresist pattern 220 as an etching mask to expose a top surface of the isolation layer 215.

Figure 10:
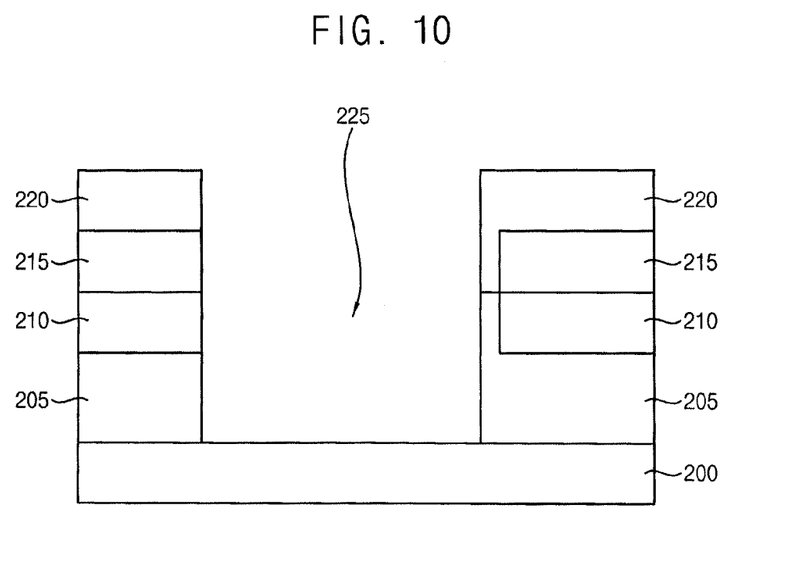

Referring to FIG. 10, portions of the isolation layer 110 and the second impurity layer 205 that are not covered by the first photoresist pattern 220 may be removed to form a first hole 225 exposing a top surface of the first impurity layer 200.

Figure 11:
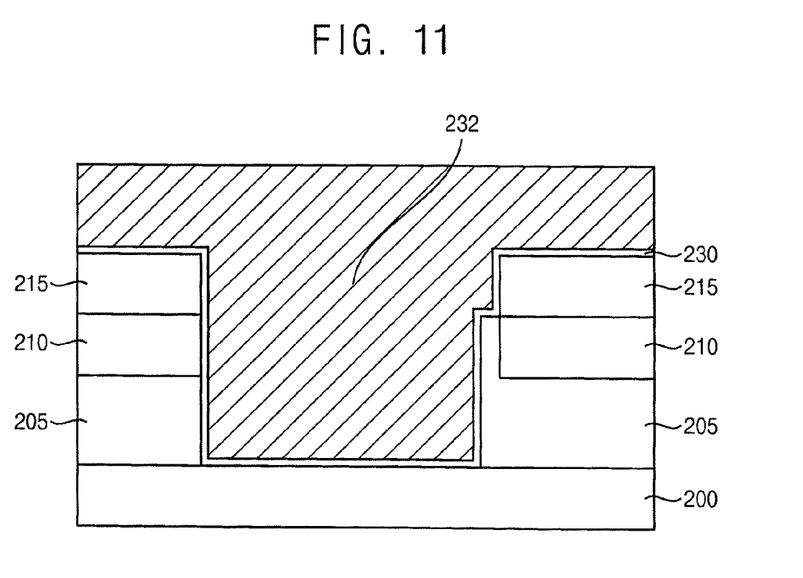

Referring to FIG. 11, after removing the first photoresist pattern 220, a gate dielectric layer 230 may be formed on the bottom surface and a sidewall of the first hole 225, on the second impurity layer 205, and on the mesa structure 215. The gate dielectric layer 230 may be formed to include, e.g., silicon oxide, a metal oxide, etc.

A gate electrode layer 232 may be formed on the gate dielectric layer 230 to sufficiently fill the first hole 225. An upper portion of the gate electrode layer 232 may be planarized. The gate electrode layer 232 may be formed to include, e.g., doped polysilicon, or a metal.

Figure 12:
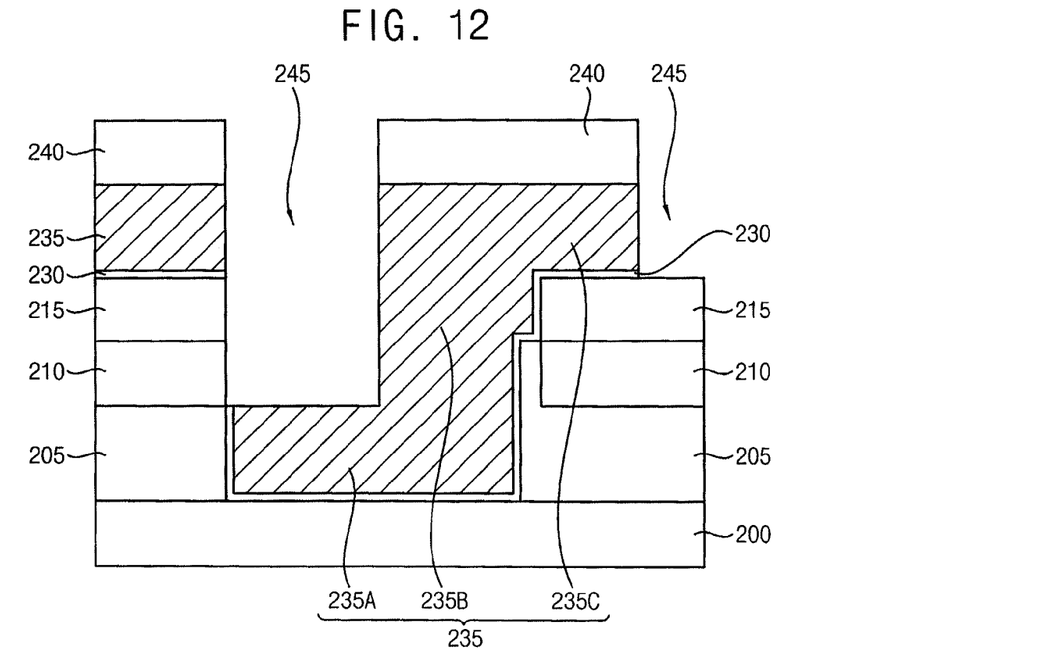

Referring to FIG. 12, a second photoresist pattern 240 may be formed on the gate electrode layer 232, and the gate electrode layer 232 and the dielectric layer 230 may be patterned using the second photoresist pattern 240 as an etching mask. In the etching process, a second hole 245 may be formed such that the gate electrode layer 232 is divided into a plurality of gate electrodes 235. In example embodiments, at least one of the gate electrodes 235 may serve as a transfer gate electrode of the CIS, which may form a transfer gate structure together with the gate dielectric layer 230 therebeneath.

In example embodiments, the gate electrode 235 serving as the transfer gate electrode may include lower, central, and upper portions 235A, 235B, and 235C, respectively, which may form a step shape. Thus, through the gate dielectric layer 230, the lower portion of the gate electrode 235 may contact the top surface of the first impurity layer 200 and a sidewall of the second impurity layer 205, and the central portion of the gate electrode 235 may contact a portion of the second impurity layer 205. Accordingly, the gate structure may contact the photodiode over a wide area.

Figure 13:
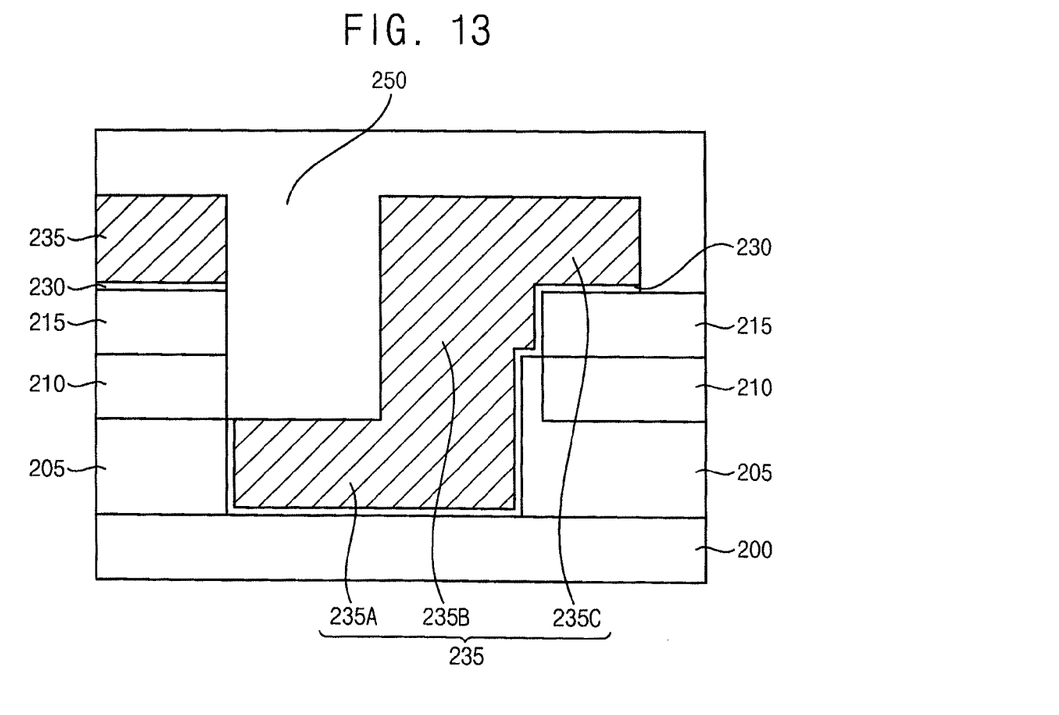

Referring to FIG. 13, after removing the second photoresist pattern 240, an insulation layer 250 may be formed on the gate electrodes 235 and the mesa structure 215 to sufficiently fill the second hole 245, so that the CIS may be manufactured.

By way of summation and review, as complementary metal oxide semiconductor (CMOS) image sensor (CIS) have become smaller and highly integrated, the transfer gate of the CIS has become smaller. Accordingly, a contact area between the transfer gate and a photodiode may be decreased, which may result in issues of transfer lag or signal noise in the CIS.

Embodiments may provide a CIS having good characteristics and a method of manufacturing a CIS having good characteristics. According to embodiments, a CMOS image sensor may have a vertical transfer gate. The transfer gate structure of the CMOS image sensor may contact the photodiode over a wide area, and thus image transfer lag or signal noise issues may be reduced.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A CMOS image sensor, comprising:
   a photodiode including a first impurity layer and a second impurity layer, the second impurity layer including a hole therein, the hole exposing a top surface of the first impurity layer, and a bottom of the hole having a step shape;
   an isolation layer on the second impurity layer; and
   a transfer gate structure including a gate electrode and a gate dielectric layer beneath the gate electrode, the gate electrode covering the entire exposed top surface of the first impurity layer via the gate dielectric layer, the transfer gate structure including a bottom surface having a step shape corresponding to the step shape of the bottom of the hole in the second impurity layer.

2. The CMOS image sensor as claimed in claim 1, wherein the gate electrode includes a lower portion, a central portion, and an upper portion thereof.

3. The CMOS image sensor as claimed in claim 2, wherein:
   the lower portion of the gate electrode is on the exposed top surface of the first impurity layer via the gate dielectric layer,
   the central portion of the gate electrode is on a first top surface of the second impurity layer via the gate dielectric layer, and
   the upper portion of the gate electrode is on a second top surface of the second impurity layer and a top surface of the isolation layer via the gate dielectric layer.

4. The CMOS image sensor as claimed in claim 2, wherein a portion of the lower portion of the gate electrode is not in an overlapping relationship with the upper portion of the gate electrode, when viewed from a top side.

5. The CMOS image sensor as claimed in claim 2, wherein a portion of the central portion of the gate electrode is not in an overlapping relationship with the upper portion of the gate electrode, when viewed from a top side.

6. The CMOS image sensor as claimed in claim 2, wherein the first top surface is lower than the second top surface.

7. The CMOS image sensor as claimed in claim 1, wherein the first impurity layer and the second impurity layer include different conductivity type impurities from each other.

8. The CMOS image sensor as claimed in claim 1, wherein the gate electrode entirely covers the bottom of the hole in the second impurity layer.

9. The CMOS image sensor as claimed in claim 1, wherein the transfer gate structure fully fills the hole in the second impurity layer.

10. A CMOS image sensor, comprising:
    a first impurity layer;
    a second impurity layer on the first impurity layer, the first impurity layer and the second impurity layer forming a photodiode;
    an isolation layer on the second impurity layer, portions of the second impurity layer and the isolation layer being absent above the first impurity layer such that a top surface of the first impurity layer is exposed and such that the second impurity layer includes at least one step between the exposed top surface of the first impurity layer and a top surface of the second impurity layer; and
    a transfer gate structure extending through the second impurity layer, the transfer gate structure on the exposed top surface of the first impurity layer and the at least one step of the second impurity layer, the transfer gate structure including a bottom surface having a step shape complementary to the at least one step of the second impurity layer, wherein the transfer gate structure includes:
    a lower portion contacting the exposed top surface of the first impurity layer,
    a central portion contacting a first top surface of the second impurity layer, and
    an upper portion contacting a second top surface of the second impurity layer and a top surface of the isolation layer.

11. The CMOS image sensor as claimed in claim 10, wherein the transfer gate structure includes a gate electrode and a gate dielectric layer beneath the gate electrode.

12. The CMOS image sensor as claimed in claim 10, wherein a portion of the upper portion of the transfer gate structure does not overlap part of the lower portion and central portion of the transfer gate structure, when viewed from a top side.

13. The CMOS image sensor as claimed in claim 10, further comprising
    an insulation layer covering the transfer gate structure and exposed portions of the isolation layer, the insulation layer extending continuously from the lower portion to the upper portion of the gate electrode structure.

14. The CMOS image sensor as claimed in claim 10, wherein the first impurity layer and the second impurity layer include different conductivity type impurities from each other.

* * * * *